US 6,558,738 B1

(12) United States Patent  (10) Patent No.: US 6,558,738 B1
Ushijima  (45) Date of Patent: May 6, 2003

(54) CIRCUIT FORMING METHOD

(75) Inventor: Hitoshi Ushijima, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 44 days.

(21) Appl. No.: 09/715,193

(22) Filed: Nov. 20, 2000

(30) Foreign Application Priority Data

Nov. 19, 1999 (JP) ............................................. 11-330027

(51) Int. Cl.⁷ .............................. B05D 5/12; H05K 3/10
(52) U.S. Cl. ........................ 427/96; 427/547; 427/530; 427/591; 427/598; 29/846; 29/875
(58) Field of Search ................................. 427/591, 598, 427/58, 96, 547, 550; 29/846, 875

(56) References Cited

U.S. PATENT DOCUMENTS 5,428,506 A * 6/1995 Brown et al. ............... 361/794
2001/0005936 A1 * 7/2001 Ushijima ..................... 29/875

FOREIGN PATENT DOCUMENTS

| JP | 107787 | * | 5/1988 | |
| JP | 9823 | * | 1/1991 | |
| JP | 198271 | * | 7/1992 | |
| JP | 11265 | * | 1/1993 | |
| JP | 6-35570 | | 5/1994 | ............ C09J/11/04 |
| JP | 7-29776 | | 1/1995 | ............ H01G/9/00 |
| JP | 53032 | * | 2/1997 | |
| JP | 345748 | * | 12/1999 | |
| JP | 203463 | * | 7/2001 | |

* cited by examiner

Primary Examiner—Brian K. Talbot
(74) Attorney, Agent, or Firm—Sughrue Mion, PLLC

(57) ABSTRACT

A circuit pattern is formed with an electrically conductive paste composed by mixing electrically conductive fillers, the shapes of which have aspect ratios, and a magnetic material, a shape of which has an aspect ratio, in a resin 4. In addition, a circuit pattern is formed with complexes 10 of electrically conductive fillers, the shapes of which have aspect ratios, and a magnetic material 2, and the circuit pattern 21 is hardened while a magnetic line of force is applied in the thickness direction of the circuit pattern 21.

18 Claims, 2 Drawing Sheets

CIRCUIT FORMING METHOD

BACKGROUND OF INVENTION

1. Field of Invention

The present invention relates to a method for forming a circuit by use of an electrically conductive paste for forming a printed circuit on a baseboard.

2. Related Art

As one of methods for producing printed circuit boards, an electrically conductive paste is coated on an insulating base board in accordance with a predetermined circuit pattern, and is heated or dried to be hardened, said electrically conductive paste comprising electrically conductive fillers such as metallic powder, metallic short fiber or carbon black dispersed in a thermoplastic resin or a thermosetting resin.

However, in this method, in case the content of the electrically conductive fillers is increased for heightening electrical conductivity, the content of the resin is relatively decreased and the adhesive strength between the electrically conductive paste and the insulating base board is lowered to easily cause the circuit to separate from the insulating base board. Further, a coating property of the paste when forming the circuit pattern or maintenance of the shape of the circuit pattern will be worsened.

Further, as to the content of the electrically conductive fillers, a unique electric characteristic is generally known that the content thereof up to about 600 to 700 phr in relation to the resin will decrease the electric resistance rate, but 800 phr or more will reversely increase the electric resistance rate. The content of the fillers is limited for increasing the electric conductivity.

SUMMARY OF INVENTION

The invention has been made in consideration of such situations. It is accordingly an object of the invention to provide a method for forming a circuit which is excellent in the coating property of the electrically conductive paste when forming a circuit pattern or maintenance of the shape of the circuit pattern as well as excellent in the electric conductivity and the adhesive strength with a base board.

For attaining the object, the method of the invention for forming a circuit is characterized in that a circuit pattern is formed with an electrically conductive paste (sometimes called briefly as "paste" hereafter) composed by mixing, in a resin, electrically conductive fillers (sometimes called briefly as "filler" or "fillers" hereafter) whose shapes have aspect ratios and a magnetic material whose shape has an aspect ratio, and said circuit pattern is hardened while a magnetic line of force is being exerting in the thickness direction of said circuit pattern. Further, for attaining the same object, the method for forming a circuit is characterized in that a circuit pattern is formed with the paste composed by mixing, in a resin, complexes of fillers whose shapes have aspect ratios and a magnetic material, and said circuit pattern is hardened while a magnetic line of force is being exerting in the thickness direction of said circuit pattern.

DETAILED DESCRIPTION OF PREFERRED EMBODIMENTS

The invention will be described in detail hereafter in reference to the attached drawings.

According to the method for forming a circuit of the invention, the paste is used, comprising the resin which is mixed with the fillers of the shape having the aspect ratio (ratio of a long diameter part to a short diameter part) and the magnetic material of the shape having the aspect ratio.

Figure 1A:
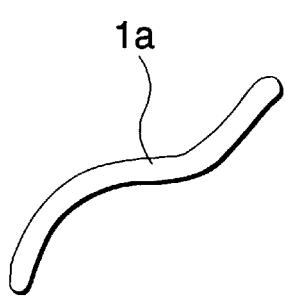
FIGS. 1(a) to (c) are views diagrammatically showing outer appearances of the electrically conductive fillers to be contained in the electrically conductive paste of the invention (a; whisker shape, b; dendritic shape, and c; flaky shape)
Figure 1B:
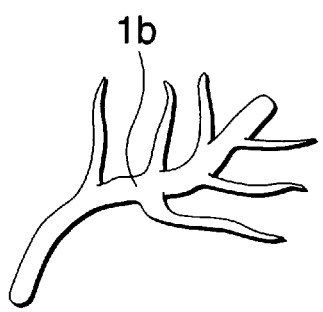
Figure 1C:
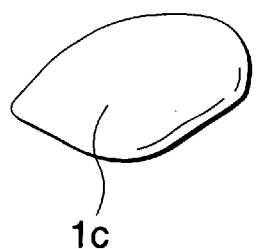

As diagrammatically shown in FIGS. 1A to 1C, the fillers used in the invention may have various shapes and optionally used, so long as having long diameter parts and short diameter parts such as a whisker shape (1a), a dendritic shape (1b) and a flaky shape (1c). The value of the aspect ratio of these filler is not specifically limited, but is preferably in a range of 2 to 10000. Therefore, so long as the aspect ratio is in this range, fiber-like fillers are sufficient. In case the aspect ratio is less than 2, the fillers in the circuit pattern have no tangle therebetween, and this is not preferable in view of the electric conductivity. On the other hand, being more than 10000, the fillers are entangled just like hairballs and are not evenly dispersed in the paste. This will cause to remarkably lower the electric conductivity and the paste coating property.

Further, materials for forming the fillers are those which may crystallize into shapes having the aspect ratios among this kind of conventional electrically conductive pastes, for example, preferable materials may include copper, silver or gold.

On the other hand, the magnetic materials having the aspect ratio may be shaped, having the aspect ratio 2 to 10000 just like the above mentioned fillers.

The kind of magnetic materials may be anything limitlessly usable so long as being magnetic members enabling to crystallize into shapes having said aspect ratios. Above all, iron based magnetic members are preferable.

Combinations of the electrically conductive filler and the magnetic material are optional, and a combination of one kind of filler and plural magnetic materials, otherwise a further combination of plural fillers and one magnetic material are available.

The weight ratio of the electrically conductive filler and the magnetic material is preferable to be 0.01 to 10 of the magnetic materials vs. 1 of the fillers. In case the weight ratio of the magnetic material is smaller than 0.01, the magnetic line of force is not sufficiently exerted, and the effect of the invention cannot be obtained. On the other hand, in case the weight ratio of the magnetic material exceeds 10, the content of the filler is relatively decreased, and the electric conductivity is lowered.

Further, according to the invention, such one body may be used which is made of the complex of the fillers and the magnetic materials having the aspect ratio. In a case of the complex, particles may be also used as the magnetic material in addition to those having an aspect ratio.

Figure 2A:
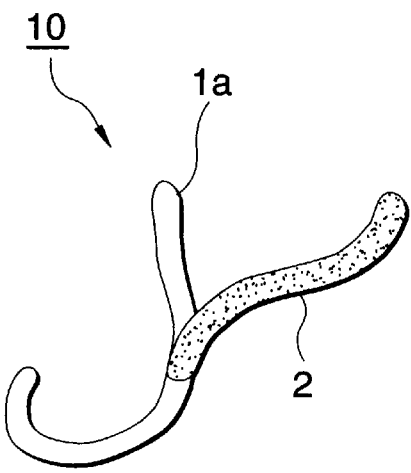
FIGS. 2(a) and (b) are views diagrammatically showing outer appearances of the complexes to be contained in the electrically conductive paste of the invention.
Figure 2B:
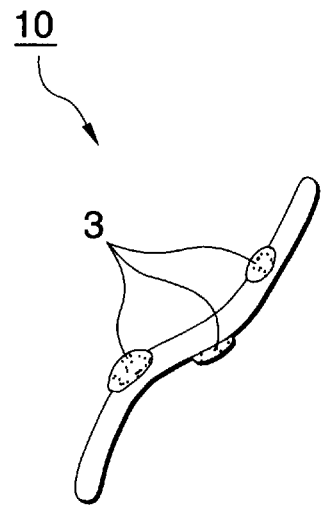

As specifically shown, there are enumerated a complex 10 which is a combination of a whisker shaped filler 1a and a whisker 2 comprising the magnetic material as shown in FIG. 2A, and a further complex 10 attached with particles 3 comprising the magnetic material on the surface of a whisker shaped filler 1a as shown in FIG. 2B.

In this case, a ratio of the filler and the magnetic material in the complex 10 is the same as the ratio when the fillers and the magnetic materials are individually used as mentioned above.

The method for producing the complex 10 is not specifically limited by this embodiment. Various methods may be available.

For example, a raw material for the electrically conductive fillers, the magnetic material and a reducing agent as carbon powder are sufficiently mixed. The mixture is then placed on a ceramic board in an electric furnace so as to cause the mixture to react at a temperature of 400 to 800° C. for 1 to 10 hours in an inactive gas atmosphere while a steam or hydrogen gas if necessary, is being introduced there into. In this way, obtained are the complexes 10 comprising the whisker shaped fillers 1a and the particles 3 of the magnetic material as shown in FIG. 2B.

The resin for dispersing the fillers and the magnetic materials or the complex 10 thereof is not specifically limited, and a thermoplastic resin or thermosetting resin as conventionally used to this kind of the electrically conductive paste may be optionally employed. For example, generally used acrylic resin, urethane resin, epoxy resin or phenol resin are applicable.

To 100 wt parts of these resins, 10 to 1000 wt parts of the filler and the magnetic material or the complex 10 are mixed. If being less than 10 wt parts, the magnetic line of force cannot be sufficiently exerted due to decrease of the content of the magnetic materials, besides the electrical conductivity is not sufficient due to decrease of the content of the fillers. On the other hand, if exceeding 1000 wt parts, the content of the resin of the paste is relatively decreased, resulting to deteriorate the coating property of the electrically conductive paste when forming a circuit pattern or maintenance of a shape of the circuit pattern as well as the electric conductivity and the adhesive strength with a base board. Furthermore, this will invite the increase of the electric resistance rate similarly in the conventional case.

Figure 3:
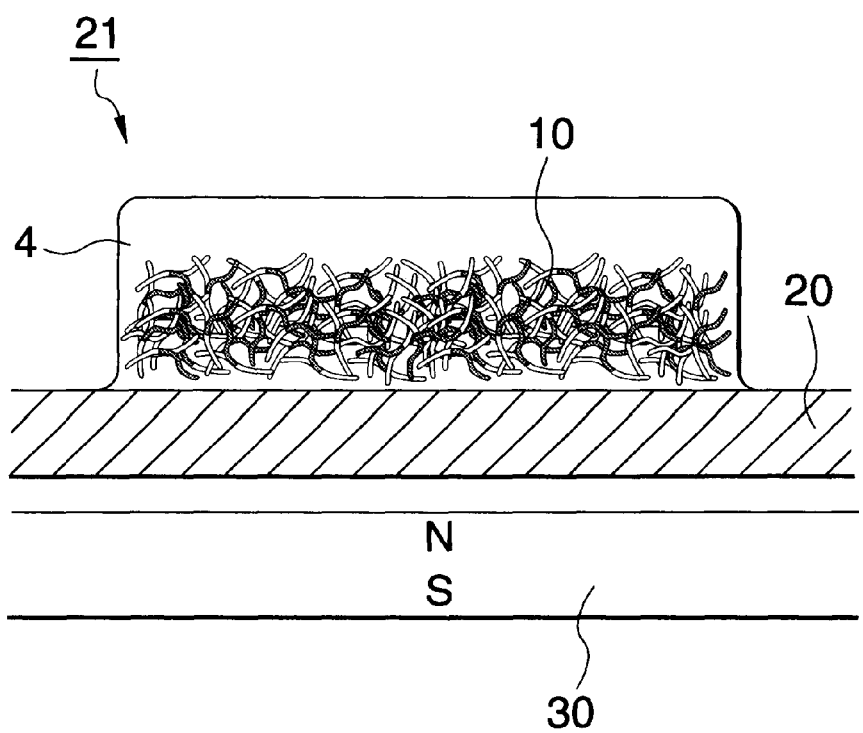
FIG. 3 is a cross sectional view showing the hardening process of the circuit pattern of the electrically conductive paste of the invention.

FIG. 3 diagrammatically shows the cross section of the circuit pattern 21 comprising the electrically conductive paste according to the invention, wherein the complex 10 of the whisker shaped filler 1a and the whisker 2 comprising the magnetic material as shown in FIG. 2A are evenly dispersed in the resin 4 under the condition that the fillers 1a are entangled one other, the whiskers 2 comprising the magnetic material are entangled, or the fillers 1a and the whiskers 2 of the magnetic material are entangled one other. Though not shown, even if using the electrically conductive paste where the electrically conductive fillers and the magnetic materials are individually mixed, the fillers and the magnetic materials are complicatedly entangled and evenly dispersed in the resin.

A reference numeral 20 in FIG. 3 denotes an insulating baseboard.

According to the invention, while the circuit pattern 21 thus formed is hardened, the magnetic line of force is activated in the thickness direction of the circuit pattern 21. The hardening method is not specifically limited, and the resin for forming the paste is hardened by heating or drying as conventionally.

The way for activating the magnetic line of force may be selected in dependence upon using objects. Namely, as shown in FIG. 3, a magnet 30 is arranged on a side opposite to the other side formed with the circuit pattern 21 of the insulating base board 20, and the circuit pattern 21 is hardened, whereby the complex 10 in the paste is pulled towards the insulating base board 20 while the rate of the resin is increased at a surface side of the circuit pattern 21, and an insulating layer or a semi-electrically conductive layer is formed at the surface of the circuit pattern. As a result, a circuit which is excellent in an insulating property and is protected at the surface is obtained.

Figure 4:
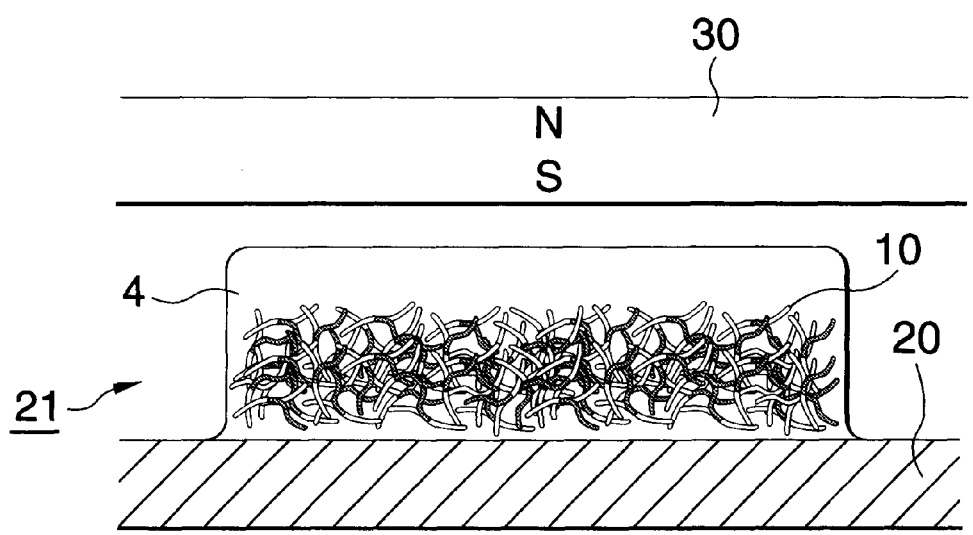
FIG. 4 is a cross sectional view showing another hardening process of the circuit pattern of the electrically conductive paste of the invention.

Further as shown in FIG. 4, the magnet 30 is arranged above the circuit pattern 21, and the circuit pattern 21 is hardened, so that the complex 10 in the paste is pulled towards the upper surface side of the circuit pattern 21 and the rate of the resin is increased at the side of the insulating base board 20. As a result, a circuit excellent in adhesive property with the insulating baseboard 20 is obtained.

In any ways as above described, the complex 10 will exist with a high density at the side of the insulating baseboard 20 of the circuit or at the upper surface side of the same. Therefore, when an equivalent electric conductivity is obtained, the content of the fillers may be decreased than the conventional one, and accordingly cost of the electrically conductive paste can be lowered due to decrease of the content of the electrically conductive fillers in addition to increase of the coating property of the paste.

As the magnet 30 to be used, a plate member of a permanent magnet is convenient in simplicity and preferable for being non-operating cost. An electromagnet may be used in combination with a yoke plate.

When the circuit pattern 21 is heated to be hardened, the heat is given to the circuit pattern at the side opposite to the magnet 30.

EXAMPLE

The present invention will be described as under further in detail by way of an example. The invention is, however, not limited to this example.

Preparation of the Electrically Conductive Paste

To a phenol resin ("PL4348" produced by Gunei Kagaku), 500 phr of pulverized dentritic fillers ("FCC-SP-99" produced by Fukuda Kinzoku Hakufun) and 100 phr of iron whiskers were added and sufficiently mixed so as to produce the electrically conductive paste.

Measurement of the Electric Resistance Rate

The above electrically conductive paste was evenly coated on the glass base board and thermohardened under condition where the magnet was arranged above the electrically conductive paste as shown in FIG. 4 to produce the sample A. Further, another sample B was produced with the electrically conductive paste evenly coated on the glass base board and thermohardened without the magnet arranged thereabove.

As to the samples A and B, the electric resistance rate was measured by a four-terminal method. Of the sample A, the electric resistance rate was 2.0 ×10–4 Ω·cm, while the electric resistance rate of sample B was 2.5 ×10–4 Ω·cm.

Measurement of the Adhesive Strength

The above electrically conductive paste was evenly coated on the PET film and was thermohardened under the condition that the magnet was arranged above the electrically conductive paste as shown in FIG. 4, and a sample C was produced. The above electrically conductive paste was evenly coated on the PET film, and thermohardened without arranging the magnet, and a sample D was produced.

As to the samples C and D, the adhesive strength between the PET film and the hardened electrically conductive paste was measured by a checkerboard-pattern tape method of JIS K 5400 8.5.2. The evaluation was made by way of a 10-point method. The sample C was 10 points while the sample D was 6 points.

It is seen from the results of measurement that if using the specific conductive paste and hardening the electrically conductive paste while activating the line of the magnetic force so as to harden the electrically conductive paste, such a circuit excellent in the electric conductivity and in the adhesion with the base board may be formed.

As described before, according to the invention, it is possible to form a circuit excellent in the coating property of the electrically conductive paste when forming the circuit pattern and in maintenance of the shape of the circuit pattern as well as in the electric conductivity and the adhesion strength with the base board.

What is claimed is:

1. A method for forming a circuit comprising the steps of:
   mixing an electrically conductive filler whose shape has an aspect ratio and a magnetic material whose shape has an aspect ratio in a resin to form an electrically conductive paste;
   forming a circuit pattern with said electrically conductive paste; and
   hardening said circuit pattern while a magnetic line of force is being exerted in the thickness direction of said circuit pattern.

2. A method for forming a circuit comprising the steps:
   mixing complexes of electrically conductive filler whose shape has an aspect ratio and a magnetic material in a resin to form an electrically conductive paste;
   forming a circuit pattern with said electrically conductive paste; and
   hardening said circuit pattern while a magnetic line of force is being exerted in the thickness direction of said circuit pattern.

3. The method for forming a circuit as defined in claim 2, wherein the magnetic material is of a shape having an aspect ratio.

4. The method for forming a circuit as defined in claim 1, wherein the electrically conductive filler has an aspect ratio in a range of 2 to 10,000.

5. The method for forming a circuit as defined in claim 2, wherein the electrically conductive filler has an aspect ratio in a range of 2 to 10,000.

6. The method for forming a circuit as defined in claim 1, wherein the magnetic material has an aspect ratio in a range of 2 to 10,000.

7. The method for forming a circuit as defined in claim 1, comprising the step of forming the electrically conductive filler from copper, silver, or gold.

8. The method for forming a circuit as defined in claim 2, comprising the step of forming the electrically conductive filler from copper, silver, or gold.

9. The method for forming a circuit as defined in claim 1, wherein the magnetic material includes iron.

10. The method for forming a circuit as defined in claim 2, wherein the magnetic material includes iron.

11. The method for forming a circuit as defined in claim 1, wherein a weight ratio of the magnetic material to the electrically conductive filler is in a range of from 0.01 to 1, to 10 to 1.

12. The method for forming a circuit as defined in claim 2, wherein a weight ratio of the magnetic material to the electrically conductive filler is in a range of from 0.01 to 1, to 10 to 1.

13. The method for forming a circuit as defined in claim 1, wherein the resin is a thermoplastic resin.

14. The method for forming a circuit as defined in claim 2, wherein the resin is a thermoplastic resin.

15. The method for forming a circuit as defined in claim 1, wherein the resin is a thermosetting resin.

16. The method for forming a circuit as defined in claim 2, wherein the resin is a thermosetting resin.

17. The method for forming a circuit as defined in claim 1, wherein the resin is an acrylic resin, urethane resin, epoxy resin, or phenol resin.

18. The method for forming a circuit as defined in claim 2, wherein the resin is an acrylic resin, urethane resin, epoxy resin, or phenol resin.

* * * * *